(12) United States Patent
Leobandung

(10) Patent No.: US 10,741,560 B2
(45) Date of Patent: Aug. 11, 2020

(54) HIGH RESISTANCE READOUT FET FOR COGNITIVE DEVICE

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/794,195

(22) Filed: Oct. 26, 2017

(65) Prior Publication Data

US 2019/0131304 A1 May 2, 2019

(51) Int. Cl.
| | | |
|---|---|---|
| *H01L 27/105* | (2006.01) | |
| *H01L 29/66* | (2006.01) | |
| *H01L 27/02* | (2006.01) | |
| *H01L 27/088* | (2006.01) | |
| *H01L 29/08* | (2006.01) | |

(Continued)

(52) U.S. Cl.
CPC .......... *H01L 27/105* (2013.01); *G06N 3/063* (2013.01); *H01L 21/0257* (2013.01); *H01L 21/26506* (2013.01); *H01L 21/3065* (2013.01); *H01L 21/3081* (2013.01); *H01L 21/823412* (2013.01); *H01L 21/823437* (2013.01); *H01L 27/0207* (2013.01); *H01L 27/088* (2013.01); *H01L 29/0847* (2013.01); *H01L 29/1033* (2013.01); *H01L 29/36* (2013.01); *H01L 29/6656* (2013.01); *H01L 29/66636* (2013.01); *H01L 29/66651* (2013.01); *H01L 21/823418* (2013.01)

(58) Field of Classification Search
CPC . H01L 27/105; H01L 27/088; H01L 21/0257; H01L 21/823418; H01L 21/26506; H01L 29/36; H01L 29/0847; H01L 21/3081; H01L 21/3065; H01L 21/823412; H01L 21/823437; H01L 27/0207; H01L 29/1033; H01L 29/6656
See application file for complete search history.

(56) References Cited

U.S. PATENT DOCUMENTS 4,285,761 A * 8/1981 Fatula, Jr. ......... H01L 21/31116
438/592
6,930,537 B1 8/2005 Ceekala et al.
(Continued)

FOREIGN PATENT DOCUMENTS

CN 105723514 A 6/2016

OTHER PUBLICATIONS

Burr, G.W. et al., "Access devices for 3D crosspoint memory" Journal of Vacuum Science & Technology B (Jul./Aug. 2014) pp. 040802-1-040802-23, vol. 32, No. 4.
(Continued)

*Primary Examiner* — Hoang-Quan Ho
(74) *Attorney, Agent, or Firm* — Tutunjian & Bitetto, P.C.; Vazken Alexanian

(57) ABSTRACT

A semiconductor device includes a source region and a drain region formed in a transistor structure. A channel region is disposed between the source region and the drain region. A cladding layer is formed on the channel region, the cladding layer including a semiconductor material. A gate dielectric of a gate structure is formed on the cladding layer.

24 Claims, 7 Drawing Sheets

(51) Int. Cl.
*H01L 29/10* (2006.01)
*H01L 29/36* (2006.01)
*H01L 21/02* (2006.01)
*H01L 21/265* (2006.01)
*H01L 21/3065* (2006.01)
*H01L 21/308* (2006.01)
*H01L 21/8234* (2006.01)
*G06N 3/063* (2006.01)

(56) References Cited

U.S. PATENT DOCUMENTS

| | | | |
|---|---|---|---|
| 7,723,786 B2 | 5/2010 | Kakoschke et al. | |
| 8,395,935 B2 | 3/2013 | Lung et al. | |
| 8,416,602 B2 | 4/2013 | Kitagawa et al. | |
| 9,583,624 B1 | 2/2017 | Lam et al. | |
| 9,673,102 B2 | 6/2017 | Liu et al. | |
| 2005/0224800 A1* | 10/2005 | Lindert | H01L 29/66795 257/66 |
| 2013/0234218 A1* | 9/2013 | Dornel | H01L 29/401 257/288 |
| 2014/0027816 A1* | 1/2014 | Cea | H01L 29/66545 257/192 |
| 2016/0284859 A1* | 9/2016 | Asami | H01L 29/7869 |
| 2017/0294360 A1 | 10/2017 | Kim et al. | |

OTHER PUBLICATIONS

Dabhi, C.T. et al., "Underlap channel silicon-on-insulator quantum dot floating-gate MOSFET for low-power memory applications" Journal of Computational Electronics (Aug. 2016) pp. 1563-1569, vol. 15, No. 4.

Gokmen, T. et al., "Acceleration of deep neural network training with resistive cross-point devices" arXiv:1603.07341 (Mar. 2016) pp. 1-19.

Takagi, S. et al., "On the universality of inversion layer mobility in Si MOSFET's: Part I-effects of substrate impurity concentration" IEEE Transactions on Electron Devices (Dec. 1994) pp. 2357-2362, vol. 41, No. 12.

International Search Report and Written Opinion issued in International Application No. PCT/IB2018/058192 dated Feb. 2, 2019, pp. 1-9.

* cited by examiner

HIGH RESISTANCE READOUT FET FOR COGNITIVE DEVICE

BACKGROUND

Technical Field

The present invention generally relates to field effect transistors (FETs), and more particularly to vertically disposed FETs with high resistance readout for cognitive device circuits.

Description of the Related Art

Cognitive device circuits can include neural networks or other machine learning device structures. Typical transistor operation prefers higher current to reduce signal delay. However, higher current transistor devices may not be suitable for many cognitive device circuits, which may need lower current specifications for proper operation.

SUMMARY

In accordance with an embodiment of the present invention, a semiconductor device includes a source region and a drain region formed in a transistor structure. A channel region is disposed between the source region and the drain region. A cladding layer is formed on the channel region, and the cladding layer includes a semiconductor material. A gate dielectric of a gate structure is formed on the cladding layer.

Another semiconductor device in accordance with another embodiment includes a substrate, a cross bar grid formed on the substrate including first lines and second lines formed transversely to the first lines, and transistors formed at intersections of first and second lines of the cross bar grid. The transistors include low current transistors having a lower channel current than normal transistors. The low current transistors include a source region and a drain region disposed on the substrate, a channel region disposed between the source region and the drain region; a cladding layer formed on the channel region; and a gate dielectric of a gate structure formed on the cladding layer.

A method for forming a semiconductor device in accordance with another embodiment includes forming a doped cladding layer on transistor structures in low current device regions; forming gate structures over the cladding layer in the low current device regions and on transistor structures in normal device regions; selectively etching the cladding layer to laterally recess the cladding layer below the gate dielectric to form recesses for low current devices in the low current device regions; forming spacers which fill the recesses in the low current devices; and forming source regions and drain regions on opposite sides of the gate structures to form the low current devices in the low current device regions and to form normal devices in the normal device regions.

Another method for forming a semiconductor device in accordance with still another embodiment includes forming a hard mask layer over a substrate; patterning the hard mask layer and transistor structures into the substrate; removing the hard mask from over the transistor structures in low current device regions; growing a doped cladding layer on the transistor structures in the low current device regions; removing the hard mask from normal device regions; forming gate structures over the cladding layer in the low current device regions and the transistor structures in the normal device regions; selectively etching the cladding layer to laterally recess the cladding layer below the gate dielectric to form recesses for low current devices in the low current device regions; forming spacers which fill the recesses in the low current devices; and forming source regions and drain regions on opposite sides of the gate structures to form the low current devices in the low current device regions and to form normal devices in the normal device regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
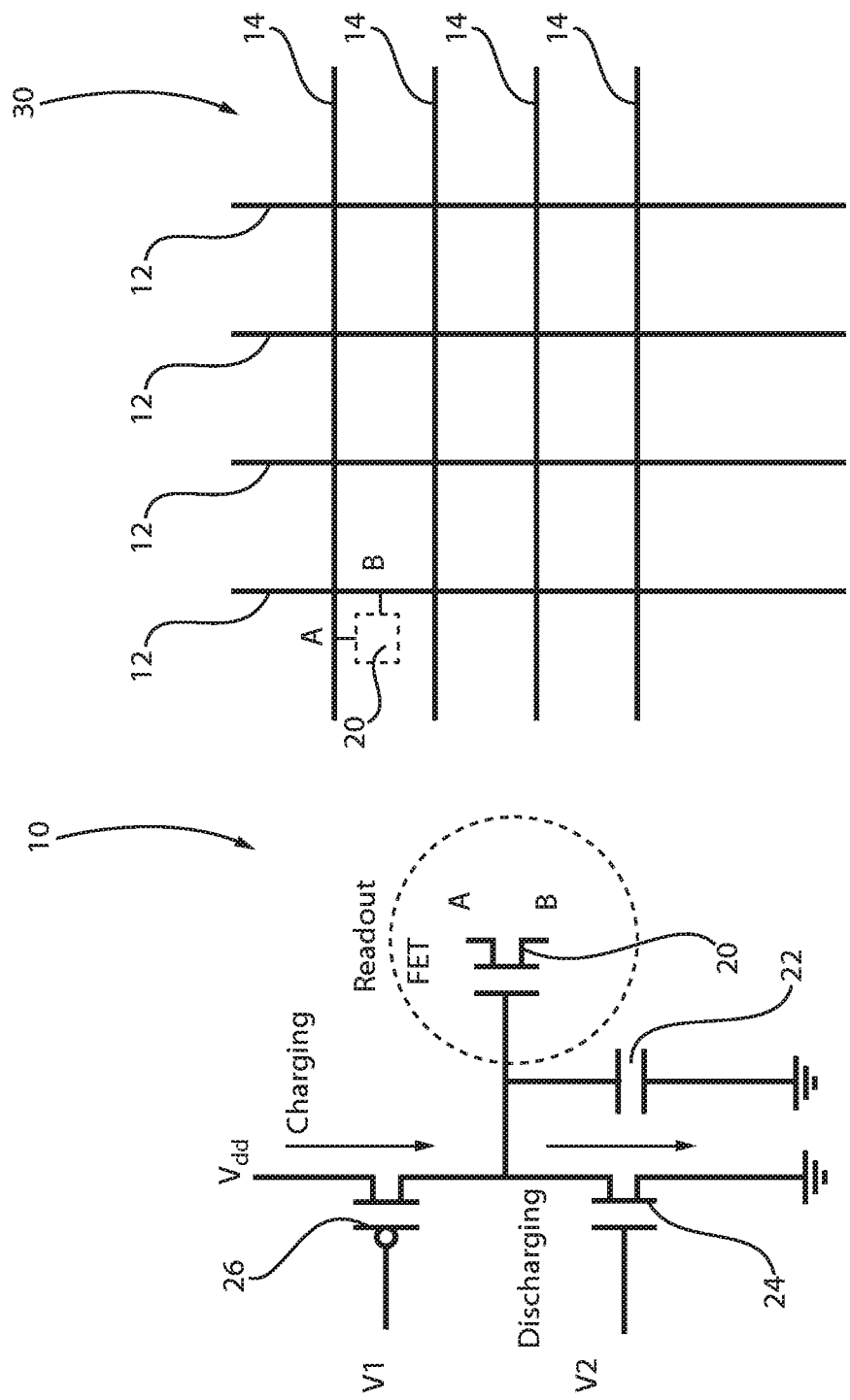
FIG. 1 is a schematic diagram showing a charge/discharge circuit along with a crossbar grid for a employing a low mobility and high resistance readout transistor in accordance with an embodiment of the present invention.

Aspects of the present invention are directed to high resistance field effect transistors (FETs). The high resistance FETs can be employed for readout operations for memory devices and are particularly useful in cognitive devices, which can include neural networks and the like. The high resistance (or low current) FETs can include low mobility properties that result in lower current. These properties can be provided by materials and doping levels in the source, drain and channel layers of the FET device. It should be understood that the applications described for the low mobility/high resistance/low current devices are illustrative and that other applications, other than a readout device, are contemplated.

In useful embodiments, the high resistance FETs can be included in crossbar circuits where the high resistance FETs are part of a circuit connecting metal lines in rows and columns of a crossbar grid. While typical transistor operation prefers higher current due to low delay performance, some applications, such as, cross bar cognitive applications, need lower current or higher resistance to provide satisfactory operation. Low mobility/high resistance/low current devices are considered to have properties that are relative to the properties of the normal devices formed on a semiconductor chip. These can include devices not modified to reduce current or carrier mobility. Normal devices are formed with conventional processes and structures.

Embodiments of the present invention include a transistor device that can include low mobility and hence low current, and be fabricated in a controllable manner. The fabrication can include the formation of a higher dopant channel cladding structure. The higher doping and an optional additional neutral scattering implant provide a scattering center for carriers, which lower the mobility of electrons or holes. Present embodiments can include planar transistor devices, although FinFETs, nanowires and other transistor structures can benefit from embodiments of the present invention. In useful embodiments, methods for forming FETs in accordance with aspects of the present invention are provided.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clear indicates otherwise. It will be further understood that the terms "comprises" "comprising," "includes" and/or "including,"

when used herein, specify the presence of stated features, integers, steps, operations, elements and/or components, but do not preclude the presence or addition of one or more other features, integers, steps, operations, components and/or groups of.

Spatially relative terms, such as "beneath," "below" "lower," "above," "upper" and the like, can be used herein for ease of description to describe one element's or feature's relationship to a elements) or feature(s) as illustrated in the FIGS. It will be understood that the spatially relative to s are tended to encompass different orientations of the device in use or operation in addition to the orientation depicted in the FIGS. For ample, if the device in the FIGS. is turned over, elements described as "below" or "beneath" other elements or features would then be oriented "above" the other elements or features. Thus, the term "below" can encompass both an orientation above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram shows a circuit 10 having a readout field effect transistor (FET) 20. The readout FET 20 is employed between nodes A and B to readout charge stored in a capacitor 22. The readout FET 20 can include a normal transistor, a low current transistor, as will be described, or other type of transistor.

The capacitor 22 is charged or discharged in accordance with inputs $V_1$ and $V_2$, which control the charging and discharging of the capacitor 22 using a charge transistor 26 and a discharge transistor 24. The charge transistor 26 and discharge transistor 24 can include a p-type FET (PFET) and an N-type FET (NFET) respectively; however, these devices and the readout transistor 20 (e.g., an NFET) can have reversed polarities, as needed.

It should be understood that the circuit 10 can include additional or different components and may perform similar or completely different tasks and have different structures (e.g., a planar transistor, finFET, nanowire transistor, etc.), as needed. In one useful embodiment, the readout FET 20 is included in a crossbar array 30. The crossbar array 30 includes a grid of transverse metal lines 12, 14 formed on or over a substrate (with, e.g., intervening layers as needed). Sources and drains (nodes A and B) of the readout FET 20 are coupled to the lines 12, 14.

In one embodiment, the crossbar array 30 forms a neural network or other cognitive device that simulates neurons. A neural network stores path information that simulates learning in devices. The properties of the readout FET 20 can be altered to provide responsiveness that simulates learning. In one embodiment, high resistance or low current can be employed to serve the objective of the array 30 as a cognitive device. Other uses and methods can also be employed.

Figure 2:
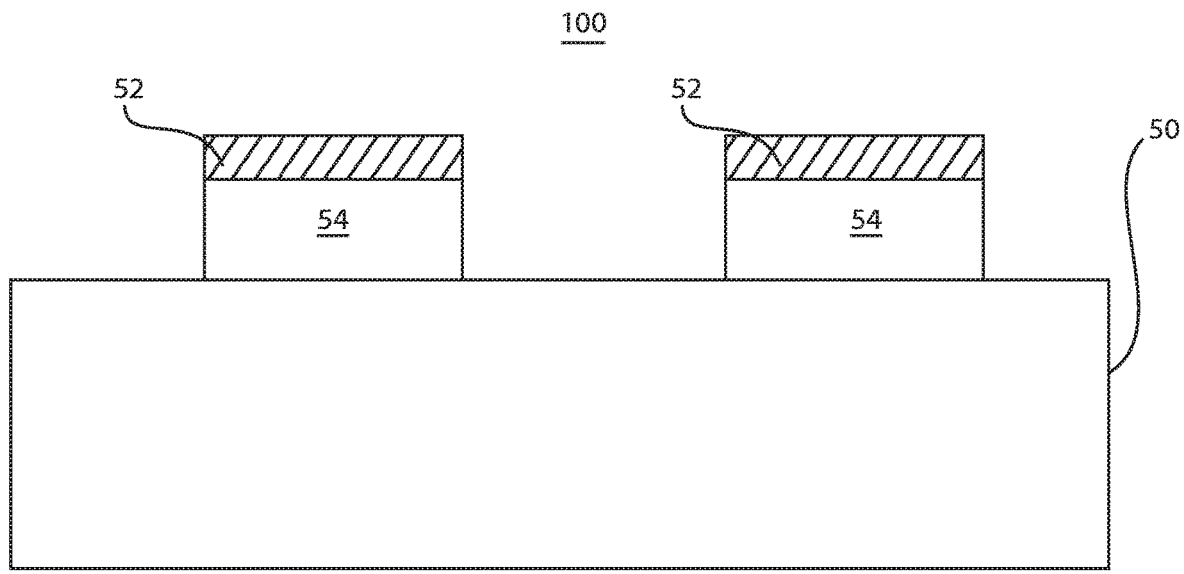
FIG. 2 is a cross-sectional view showing a device with transistor structures formed with a hardmask thereon in accordance with an embodiment of the present invention.

Referring to FIG. 2, a cross-sectional view of a semiconductor device 100 is shown in a partially fabricated state. In this example, the device 100 has undergone previous processing to form a hard mask or dielectric layer 52 over a substrate 50. The hard mask layer 52 can include dielectric materials, such as, e.g., oxides, nitrides, and oxynitrides of silicon or other suitable dielectric materials.

The hard mask layer 52 is patterned using a pattern processing techniques, such as, e.g., lithography. The hard mask layer 52 is patterned to define regions for the formation of transistor structures 54. The regions defined are for active areas of transistor devices to be formed. In this case, planar devices will be described and shown in the FIGs.; however, other device structures, such as, e.g., fins, nanowires, vertical devices, etc. can be employed. Such structures may employ transistor structures 54 having different shapes or forms.

The transistor structures 54 are etched into the substrate 50 by an etching process, such as a reactive ion etch (RIE) or other anisotropic etch process using the pattern of the hard mask 52 to define the regions 54. The transistor structures 54 can include fins, nanowires, a substrate plateau, a surface or other portions of a substrate, etc.

The semiconductor device 100 includes the substrate 50 which can include one or more layers. The substrate 50 can include any suitable substrate structure, e.g., a bulk semiconductor, a semiconductor-on-insulator (SOI) substrate, etc. In one example, the substrate 50 can include a silicon-containing material. In another embodiment, the substrate can be employed to grow or etch nanowires.

Illustrative examples of Si-containing materials suitable for the substrate 50 can include, but are not limited to, Si, SiGe, SiGeC, SiC and multi-layers thereof. Although silicon is the predominantly used semiconductor material in wafer fabrication, alternative semiconductor materials can be employed or included as additional layers, such as, but not limited to, germanium, gallium arsenide, gallium nitride, silicon germanium, cadmium telluride, zinc selenide, etc. Other substrate materials are also contemplated.

Figure 3:
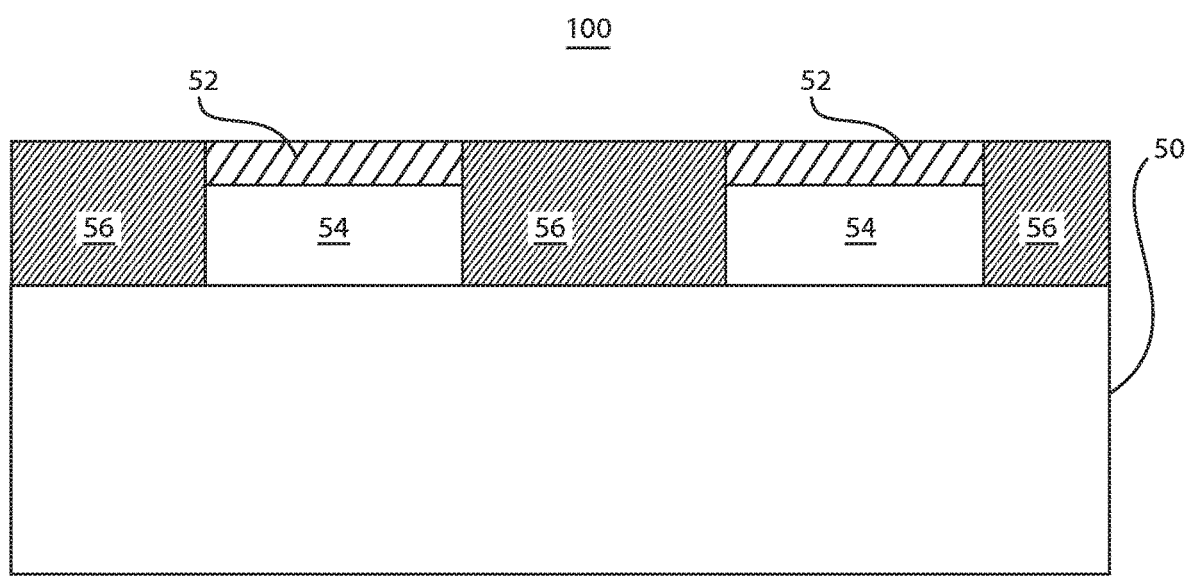
FIG. 3 is a cross-sectional view showing the device of FIG. 2 with a dielectric layer planarized between the transistor structures in accordance with an embodiment of the present invention.

Referring to FIG. 3, a dielectric material 56 is formed over the surface of the device 100 and fills in between structures 54. The dielectric material 56 can include an oxide, such as a silicon oxide, or other suitable dielectric material. In one embodiment, the dielectric material 56 can be formed by chemical vapor deposition (CVD), physical vapor deposition (PVD) or any other suitable deposition process.

A planarization process or the like may be employed to planarize a top surface of the device 100 and remove access dielectric material 56 down to the hard mask layer 52. The planarization process can include an etch process or a chemical mechanical polish (CMP).

Figure 4:
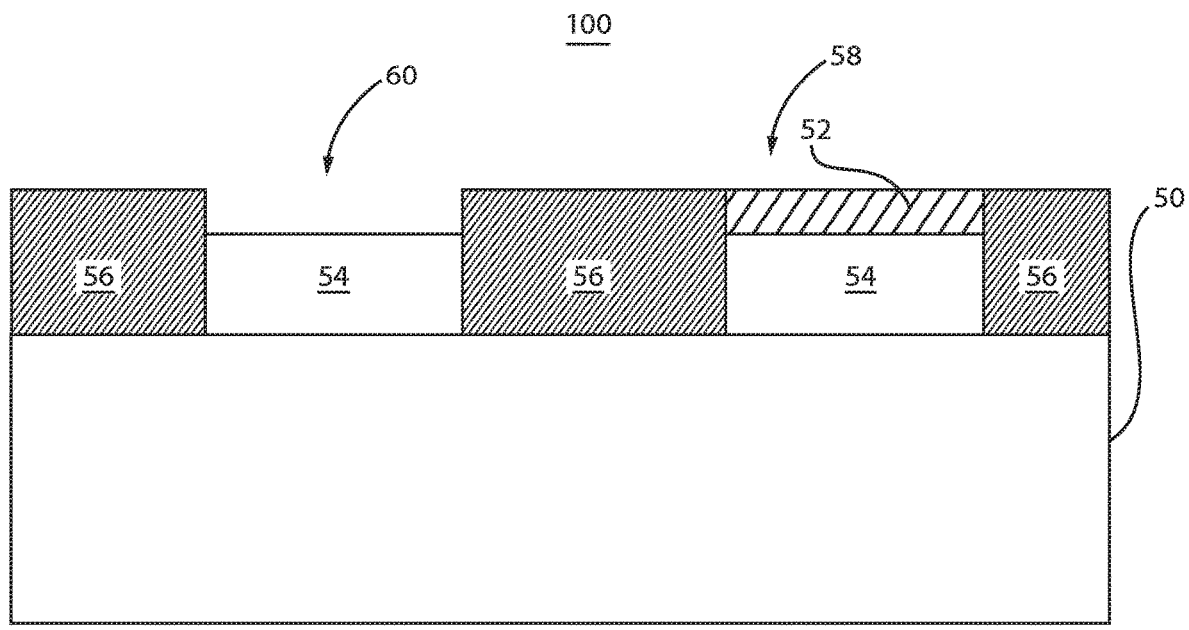
FIG. 4 is a cross-sectional view showing the device of FIG. 3 with the hard mask removed for low current devices in accordance with an embodiment of the present invention.

Referring to FIG. 4, a masking process is performed to cover normal device regions 58 and expose low current device regions 60. The masking process can include the formation of a blocking layer (not shown) over the surface of the device 100. The blocking layer (not shown) can be patterned to expose the low current device regions 60. Then, an etch process can be performed to remove the hard mask layer 52 from the low current device regions 60. This exposes the transistor structures 54 in the low current device regions 60 for processing specific to the low current device formation. In a particularly useful embodiment, the low current device formation can include the formation of a readout FET or other device. The blocking layer (not shown) can be removed.

Figure 5:
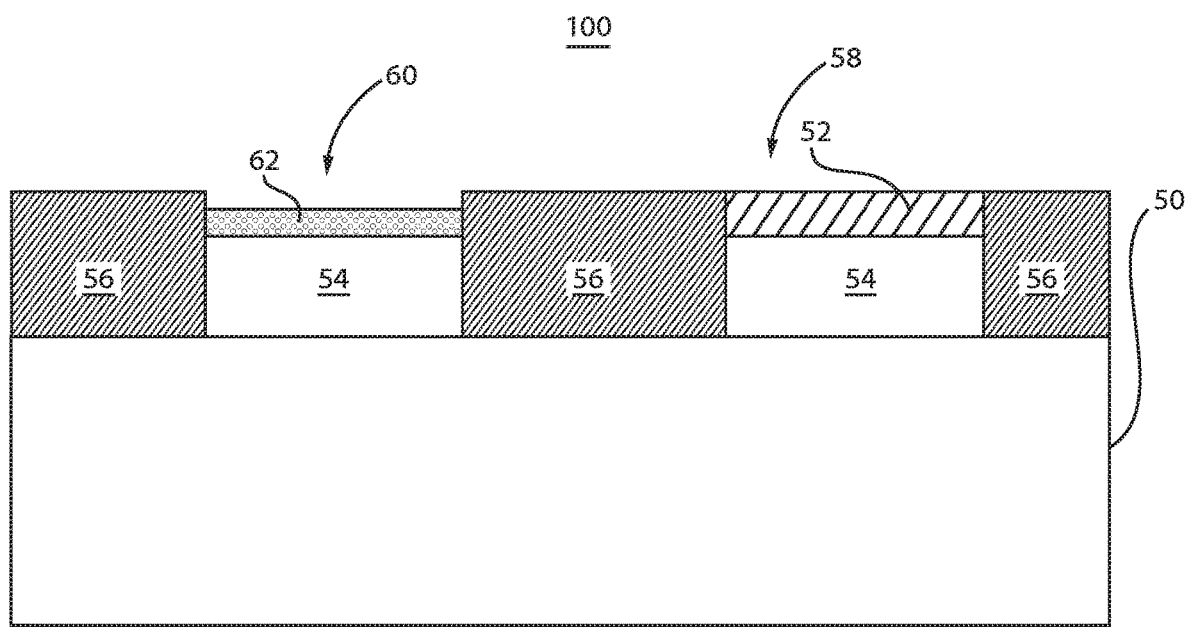
FIG. 5 is a cross-sectional view showing the device of FIG. 4 with a cladding layer grown on the transistor structures for the low current devices in accordance with an embodiment of the present invention.

Referring to FIG. 5, a high dopant cladding layer 62 is grown on the transistor structure 54 in the low current device regions 60. The high dopant cladding layer 62 can include the substrate material with a high dopant concentration to form an N-type FET (NFET) or a P-type FET (PFET). In one embodiment, the high dopant cladding layer 62 can include arsenic (As) or phosphorus (P) having a doping concentration of greater that about $1\times10^{18}$ dopants or atoms per $cm^3$, and preferably greater than $1\times10^{19}$ dopants or atoms per $cm^3$ for a PFET). The high dopant cladding layer 62 can be between about 2 nm to about 15 nm. Other dimensions can be employed. The high dopant cladding layer 62 prefer includes a higher dopant concentration than the material the high dopant cladding layer 62 is formed on.

In another embodiment, the high dopant cladding layer 62 can include boron (B) or gallium (Ga) having a doping concentration of greater that about $1\times10^{18}$ atoms per $cm^3$, and preferably greater than $1\times10^{19}$ dopants per $cm^3$ for an NFET. The high dopant cladding layer 62 can be between about 2 nm to about 15 nm. Other dimensions can be employed.

The high dopant cladding layer 62 can be epitaxially grown and can be a single crystal, polycrystalline or amorphous. The dopants for the high dopant cladding layer 62 can be provided in-situ or can be implanted within the structure 54 by ion implantation or other doping process (e.g., deposition of a layer and diffusing the dopants into the structure 54).

Figure 6:
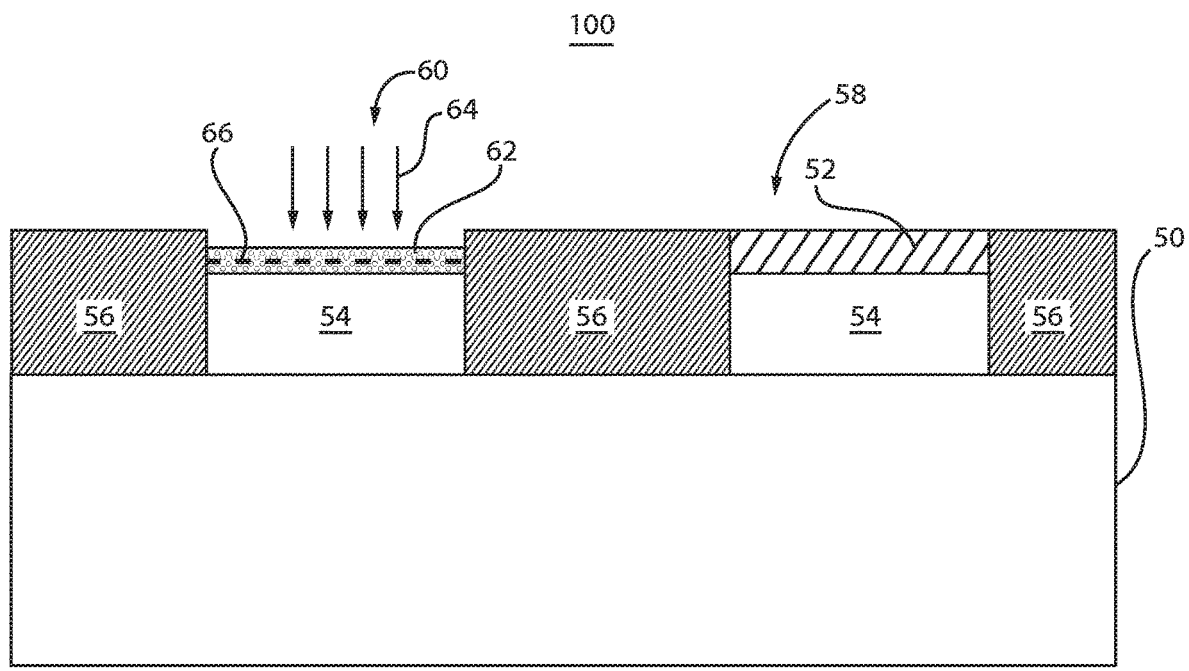
FIG. 6 is a cross-sectional view showing the device of FIG. 5 with a scattering center formed in the cladding layer by ion bombardment of inert species in accordance with an embodiment of the present invention.

Referring to FIG. 6, an optional scattering center 66 is formed within the cladding layer 62 to further reduce electron or hole mobility. The scattering center 66 can include a concentration of inert materials implanted in the cladding layer 62. Implant scattering center 66 can optionally be formed to adjust lattice disorder of the cladding layer 66 to provide low current device characteristics, e.g., lower carrier mobility, increase device resistance, etc. In one embodiment, the scattering center 66 includes inert dopants 64, such as, e.g., Ar, Xe, other noble gases or other inert materials. The inert dopants 64 can be implanted by ion bombardment or other process. The dopant dosage can be from about $1\times10^{13}$ to about $1\times10^{15}/cm^2$. The implantation or ion bombardment can include any suitable implantation methods. The implant scattering center 66 is only formed on the low current FETs in the low current device regions 60.

Figure 7:
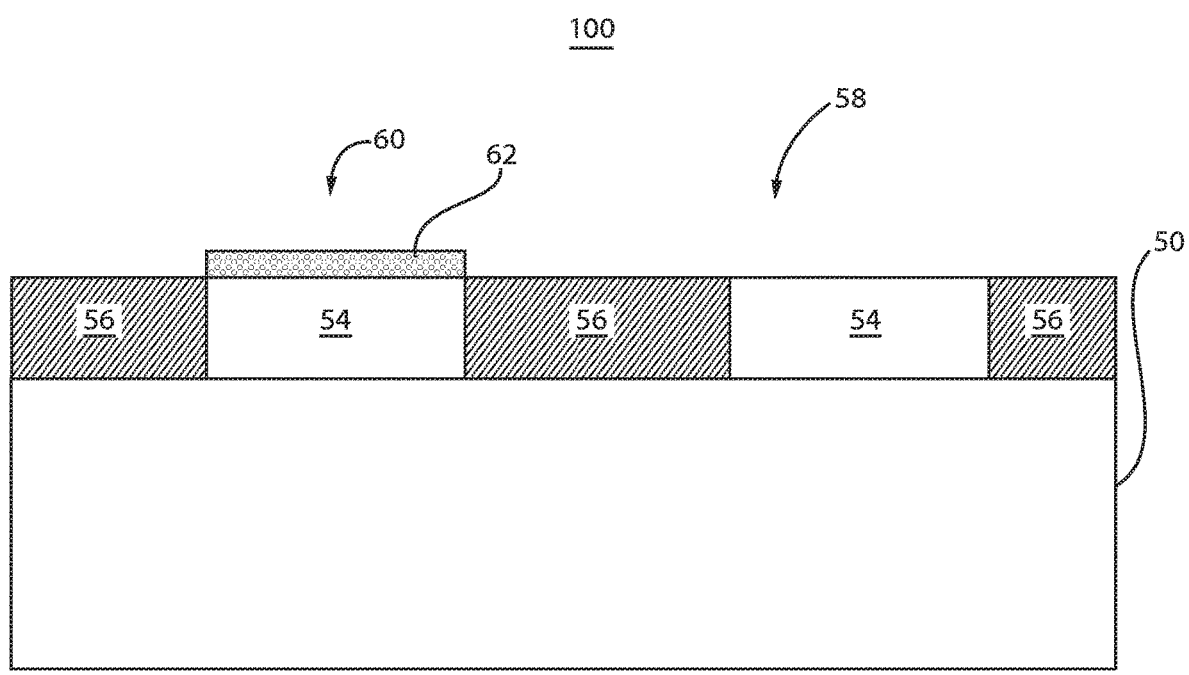
FIG. 7 is a cross-sectional view showing the device of FIG. 6 with the dielectric layer recessed below the cladding layer in accordance with an embodiment of the present invention.

Referring to FIG. 7, the hard mask layer 52 can be removed over the normal device regions 58. The hard mask layer 52 can be removed by a selective wet or dry etch. A dielectric layer recess is then performed by a dry or wet etch selective to the cladding layer 62 to recess the dielectric material 56. In one embodiment, the dielectric material 56 is recessed below the cladding layer 62. In other embodiments, the dielectric material 56 is recessed to a height within a thickness of the cladding layer 62.

Figure 8:
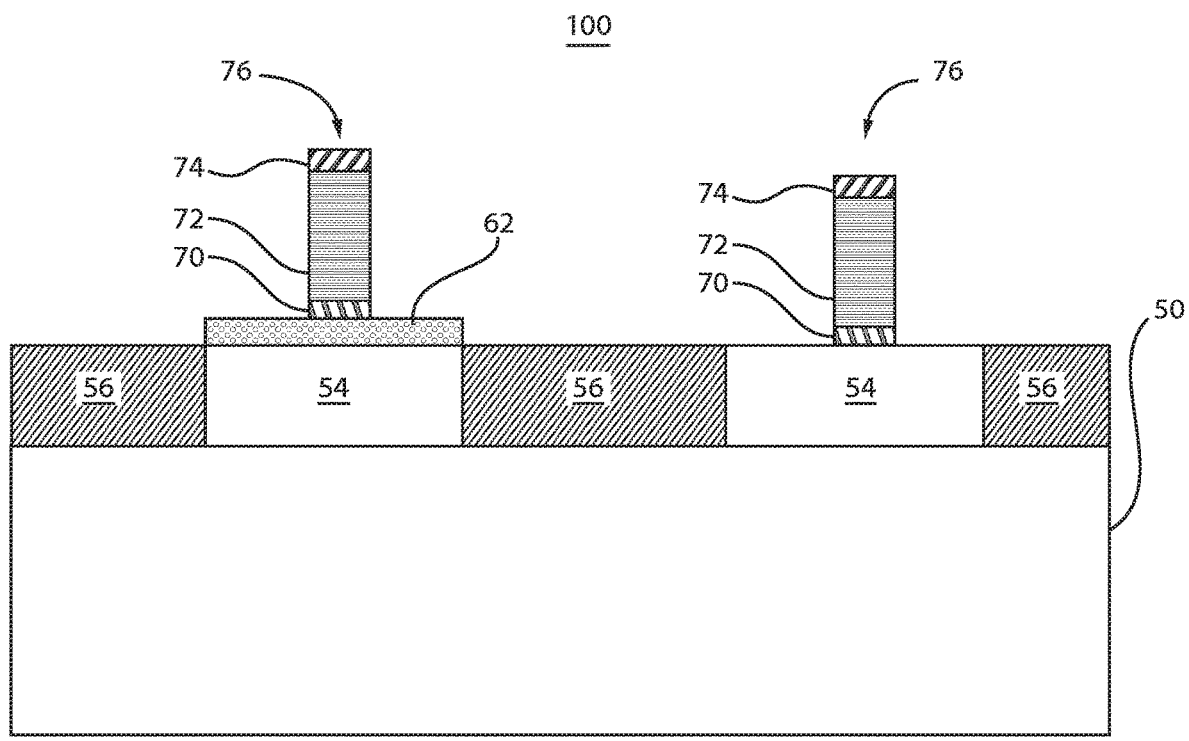
FIG. 8 is a cross-sectional view showing the device of FIG. 7 with gate structures (metal gate or dummy) formed on the cladding layer for the low current devices and on the transistor structure for normal devices in accordance with an embodiment of the present invention.

Referring to FIG. 8, a gate dielectric layer 70 is formed over the device 100. The gate dielectric layer 70 forms a gate dielectric between the cladding layer 62 and a gate conductor layer 72 formed over the dielectric layer 70. The gate dielectric layer 70 can be formed using chemical vapor deposition (CVD), physical vapor deposition (PVD) or other suitable deposition processes. The dielectric layer 70 can include an oxide, a nitride or other suitable dielectric material. In one embodiment, the dielectric layer 70 includes a "high-k" dielectric material featuring a dielectric constant (k) higher than the dielectric constant of $SiO_2$. High-k dielectric materials can include, but are not limited to, hafnium oxides, hafnium silicates, titanium oxides, barium-strontium-titanates (BSTs) and lead-zirconate-titanates (PZTs).

The gate conductor layer 72 includes a conductive material including, but not limited to metals, metal alloys, metal nitrides and metal silicides, as well as laminates thereof and composites thereof. In one embodiment, the gate conductor layer 72 may be any metal including, but not limited to, e.g., W, Ni, Ti, Mo, Ta, Cu, Pt, Ag, Au, Ru, Ir, Rh, and Re, and alloys that include at least one of the aforementioned conductive elemental metals. The gate conductor layer 72 may also include doped polysilicon and/or polysilicon-germanium alloy materials (i.e., having a dopant concentration from $1\times10^{18}$ dopant atoms per cubic centimeter to $1\times10^{22}$ dopant atoms per cubic centimeter) and polycide materials (doped polysilicon/metal silicide stack materials).

In useful embodiments, the gate conductor layer 72 includes a metal deposited using CVD, sputtering or other suitable deposition process. Examples of metals that may be employed for the at least one gate conductor layer may include, but are not limited to, W, Ti, Ta, Cu, Pt, Ag, Au, Al, TiN, WN, TaN, TiAlN, TaAlN, and alloys thereof. The gate conductor layer 72 can include multiple layers with one or more materials. The cladding layer 62 is formed over a channel layer between source and drain regions which will be formed.

A dielectric cap layer or hard mask layer 74 is deposited over the gate conductor layer 72, e.g., by CVD or other suitable process. The cap layer 74 can include an oxide, a nitride, or any other suitable dielectric material.

In one embodiment, the gate dielectric layer 70, the gate conductor layer 72 and the cap layer 74 are patterned. The gate dielectric layer 70, the gate conductor layer 72 and the cap layer 74 can be patterned using a single etch mask to form patterned gate structures 76. The gate structures 76 are concurrently formed in both the normal device regions 58 and the low current device regions 60. The gate structure 76 is formed on the cladding layer 62 in the low current device regions 60, and the gate structure 76 is formed on the transistor structure 54 in the normal device regions 58.

The gate structures 76 can be patterned to control the size and shape of the gate structures 76. The patterning process can include a lithographical patterning process or any other patterning process. In one example, a photoresist can be deposited over the cap layer 74 and exposed to radiation (e.g., ultraviolet (UV) light) to form a resist mask (not shown). Then, an anisotropic etch, such as, e.g., a reactive ion etch (RIE) process can be performed to etch the cap layer 74, the gate conductor layer 72 and gate dielectric layer 70. It should be understood that the gate structures 76 can include a real gate (gate conductor formed initially) or a dummy gate (for replacement gate).

Figure 9:
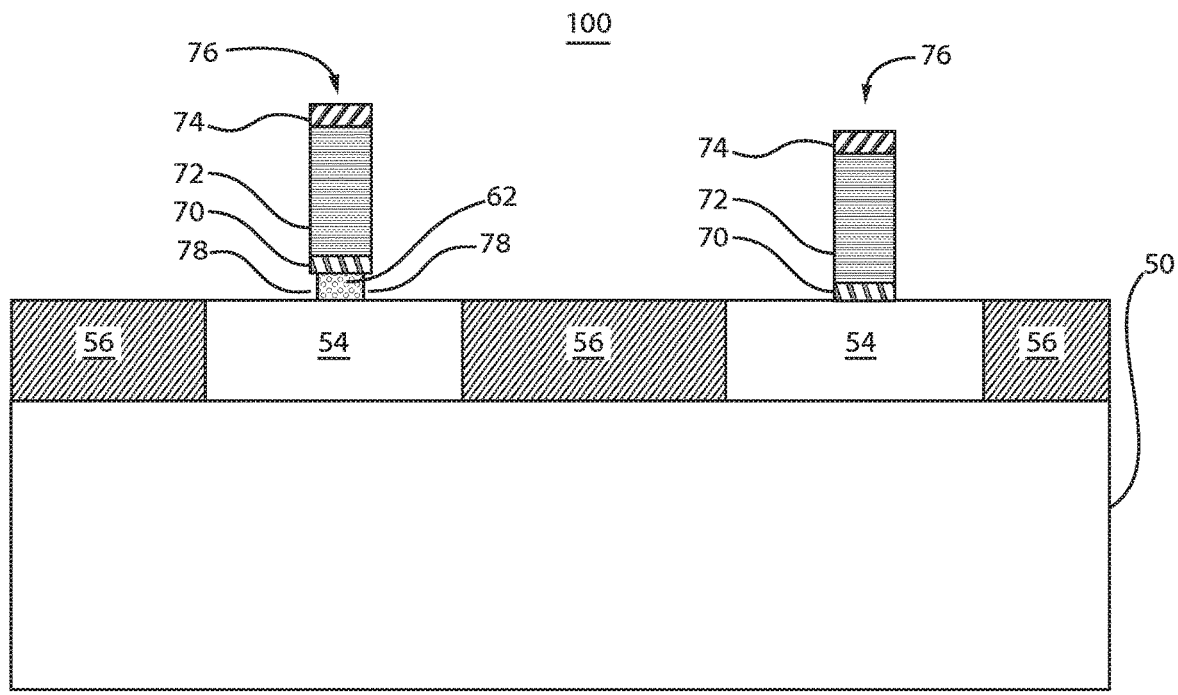
FIG. 9 is a cross-sectional view showing the device of FIG. 8 with the cladding layer recessed below the gate structures for the low current devices in accordance with an embodiment of the present invention.

Referring to FIG. 9, an etch process is performed to etch exposed portions of the highly doped cladding layer 62. The cladding layer 62 can include a highly doped silicon layer and can be etched selectively to the undoped layer of the transistor structure 54 below the cladding layer 62. In one embodiment, the wet etch is performed to recess the cladding layer 62 to form lateral recesses 78.

Figure 10:
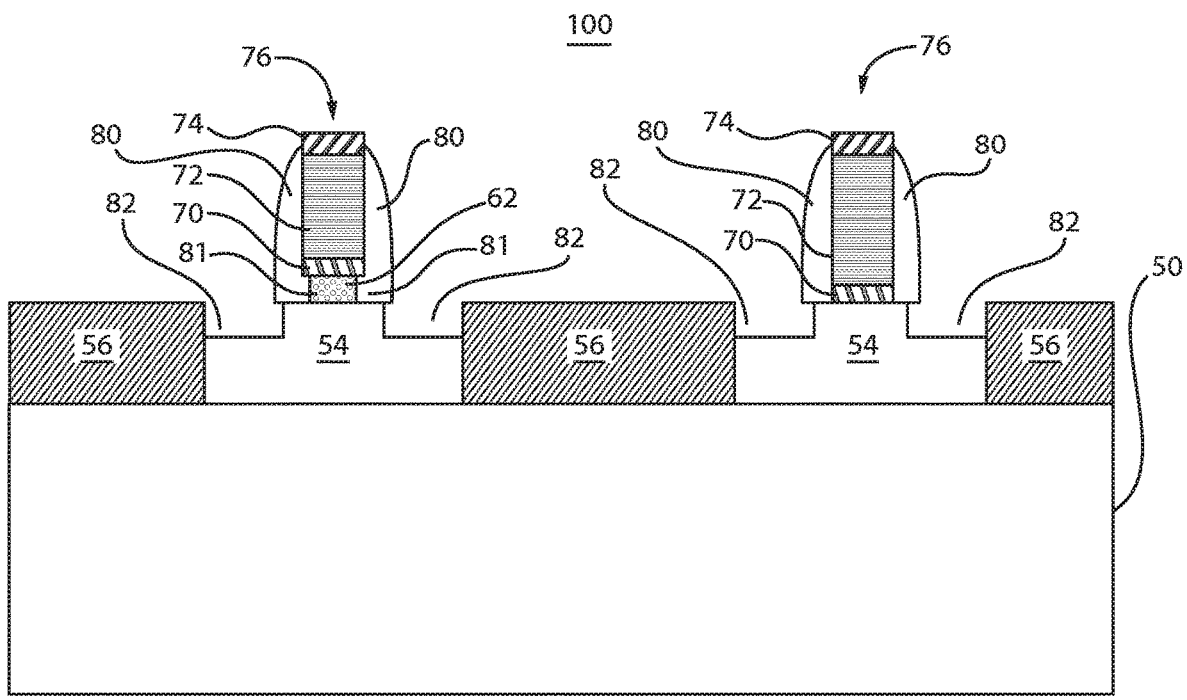
FIG. 10 is a cross-sectional view showing the device of FIG. 9 with spacers formed on sidewalls of the normal and low current devices and within the recesses of the cladding layer for the low current devices and recesses formed for source and drain regions in accordance with an embodiment of the present invention.

Referring to FIG. 10, gate sidewall spacers 80 may be formed in direct contact with the gate structures 76. The gate sidewall spacers 80 may be formed by depositing a conformal layer of dielectric material, such as an oxide, nitride, oxynitrides or other material on the gate structures 76 followed by an etch process that removes the conformal layer from the horizontal surfaces except for the sidewalls of the gate structures 76. The gate sidewall spacers 80 may have a width ranging from about 1 nm to about 10 nm. The gate sidewall spacers 80 in the low current device regions 60 fill the recesses 78 (FIG. 9) to form offset spacer regions 81.

Following the formation of the gate sidewall spacers 80, source regions and drain regions may then be formed using the spacers 80 to assist in defining recesses 82 etched into the transistor structures 54. The source and drain recesses 82 can be formed on opposing sides of the gate structures 76 in both the normal device regions 58 and the low current device regions 60. The transistor structures 54 are etched using a selective RIE process and etched below a surface of the dielectric layer 56.

Figure 11:
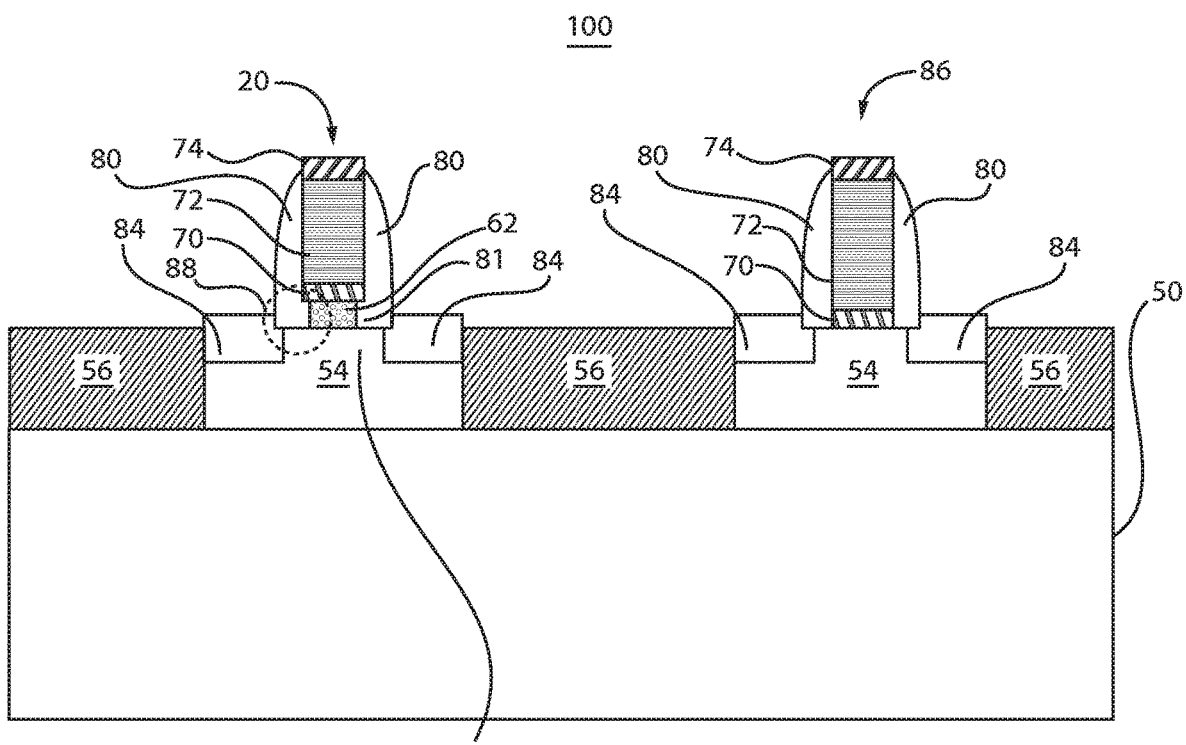
FIG. 11 is a cross-sectional view showing the device of FIG. 10 with source and drain regions formed resulting in an undercut region in a channel region or the low current devices in accordance with an embodiment of the present invention.

Referring to FIG. 11, source and drain (S/D) regions 84 are formed by epitaxial growth from the material on the transistor structures 54. Note that the sources and drains 84 do not touch the low mobility cladding layer 62 to improve reliability and reduce leakage. The epitaxial growth process can include in-situ doping. In one embodiment, S/D regions 84 are grown as highly doped regions, e.g., having a doping concentration of between about $1\times10^{20}/cm^3$ to about $1\times10^{21}/cm^3$, preferably about $5\times10^{20}/cm^3$. In one embodiment, a p-type dopant, such as, e.g., boron (B) can be employed for a PFET drive, arsenic (As) or phosphorous (P) for an NFET device. The S/D regions 84 can be above, below or even with the dielectric layer 56.

S/D regions 84 can be epitaxially formed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain regions can range from about $1\times10^{20}$ $cm^{-3}$ to about $1\times10^{21}$ $cm^-$, or preferably about $5\times10^{20}$ $cm^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a { 100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

A low current FET device 20 is realized using several features. One feature includes the cladding layer 62 having a dopant type opposite to the source/drain type. For example, if the cladding layer 62 includes p-type dopants, the S/D regions 84 include an NFET device and n-type dopants or vice versa. These cladding dopants contribute to higher channel resistance and decreased carrier mobility. In addition, scatter center dopants (64, FIG. 6) can cause defects in the structure of the cladding layer 62, and these defects can have an impact on channel properties of the device 20 further increasing channel resistance and decreasing carrier mobility. Also, the cladding layer 62 does not touch the source/drain regions 84 (separated by the spacers 80) to improve reliability and leakage.

Another feature includes an underlap region 88 where the spacer 80 forces the source and drain regions 84 to be offset from the channel 90 a bit, which results from the formation of the cladding layer 62 and spacers 80. The underlap region 88 undercuts the channel 90, reduces overlap dopant diffusion regions by the out diffusion of dopants from the S/D regions 84 and further reduces channel current. In the normal device and the low current device, after the S/D regions 84 are formed, an anneal can be performed to cause a drive-in of dopants into the channel region 90 from the S/D regions 84. The low current device 20 will be underlapped due to the undercut of the S/D regions 84 near the channel 90 by the spacers 80 and the cladding layer 62.

Another feature is that the gate conductor 72 is gapped by an additional distance (thickness of the cladding layer 62) from the channel region 90. These features can be combined and adjusted to provide the needed performance characteristics for the low current device 20. These features can be provided and/or adjusted while still producing normal devices 86 in the same processing sequence.

After the S/D regions 84 are formed, normal middle of the line (MOL) and back end of the line (BEOL) processing can be performed. In one embodiment, a replacement metal gate (RMG) process may be employed if a dummy gate structure was employed. MOL and BEOL processing can include the formation of interlevel dielectric layers, contacts, metal lines, etc. This can also include the formation a cross bar metal line grid.

Figure 12:
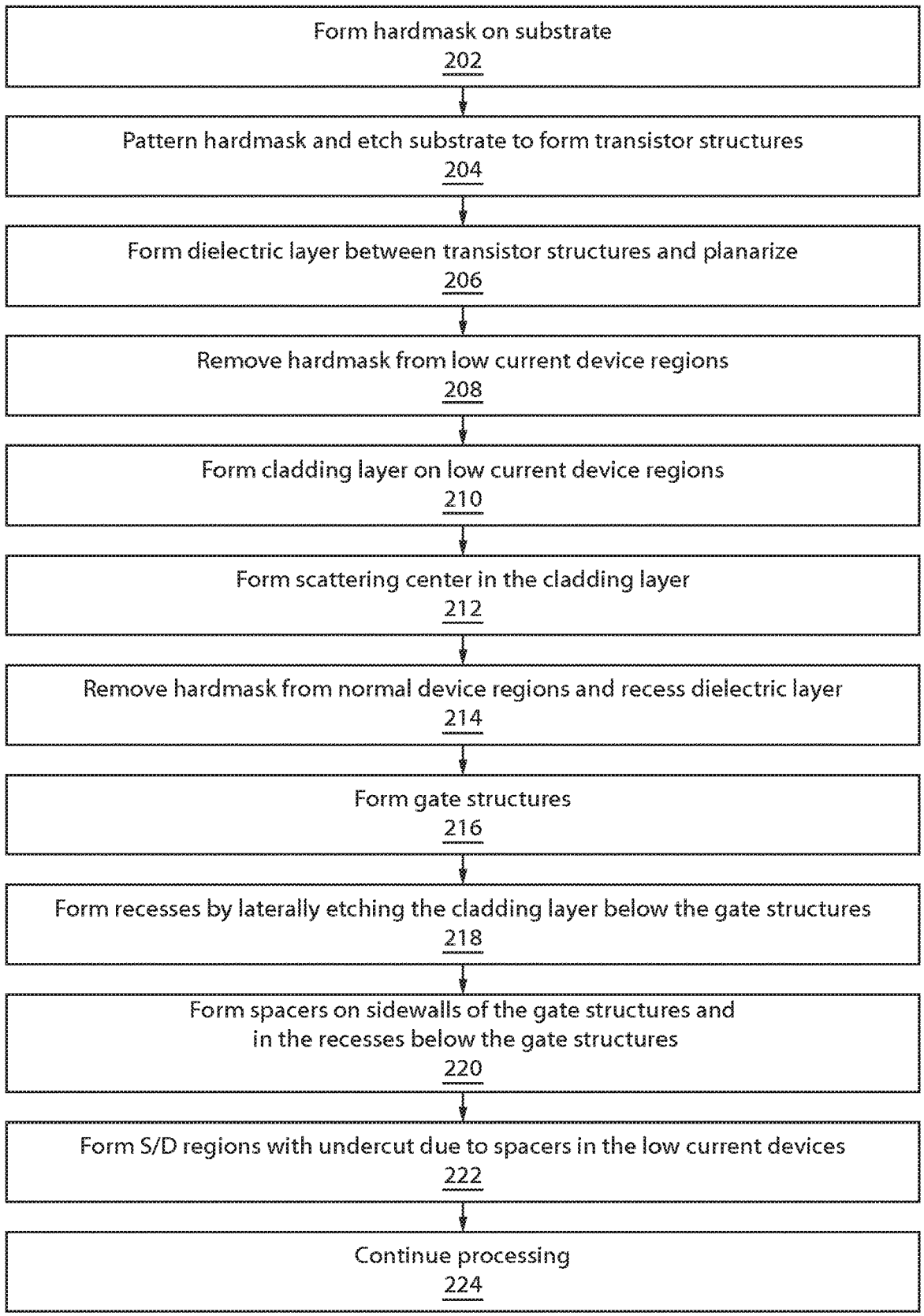
FIG. 12 is a block/flow diagram showing methods for forming low current devices in accordance with embodiments of the present invention.

Referring to FIG. 12, a block/flow diagram showing methods for forming a semiconductor device is illustratively depicted. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, forming a hard mask layer is formed over a substrate or nanowire. In block 204, the hard mask layer is patterned and the substrate or nanowire is etched to form transistor structures. The transistor structures can include plateaus formed by etching the substrate, fins formed by etching or nanowires formed or processed by etching. The etching can include a reactive ion etch process.

In block 206, a dielectric layer is deposited over the transistor structures and planarized to the hard mask, e.g., using a CMP process. The dielectric layer is optional in some embodiments, but can be employed to protect portions of the substrate, provide shallow trench isolation and/or provide electrical isolation between adjacent devices.

In block 208, the hard mask is removed from over the transistor structures in low current device regions. This can be performed by blocking or protecting normal device regions to remove the hardmask by selective etching only in the low current device regions.

In block 210, a doped cladding layer is grown on the transistor structures in the low current device regions. This can include an epitaxial growth process with in-situ doping although other forms of deposition and doping can be employed. The doping conductivity is selected to include a conductivity opposite to that of the source and drain regions. In useful embodiments, the doped cladding layer includes a doped material having a dopant concentration of between about $5 \times 10^{18}$ to about $5 \times 10^{19}$ atoms/cm$^3$. In other useful embodiments, the cladding layer includes a thickness between about 2 nm to about 15 nm.

In block 212, a scattering center can optionally be formed within the cladding layer. The scattering center can be formed by bombarding the cladding layer with noble gas ions, such as, e.g., Ar or Xe.

In block 214, the hard mask is then removed from the normal devices in the normal device regions, e.g., by a selective etch or by using blocking masks. The dielectric layer can be recessed by an etch process. The recess can include exposing the lateral sides of the cladding layer.

In block 216, gate structures are formed over the cladding layer in the low current device regions and on the transistor structures in normal device regions. The gate structures can include a gate dielectric layer, one or more conductive layers or a dummy gate material layer and a cap layer. The gate structures are etched from these layers in a patterned etch or etches (e.g., a reactive ion etch).

In block 218, a selective etch of the cladding layer is performed to laterally recess the cladding layer below the gate dielectric to form recesses (below the gate dielectric) for low current devices in the low current device regions. The etch can include a wet or dry etch.

In block 220, spacers are formed, which fill the recesses in the low current devices. A spacer layer can be formed with a conformal deposition followed by a reactive ion etch so a portion of the deposited spacer layer remains on sidewalls of the gate structures (and within the recesses adjacent to the cladding layer).

In block 222, source regions and drain regions are formed on opposite sides of the gate structures. Recesses may be formed within the transistor structures (or fins or nanowires), e.g., using the spacers to self-align etching to open up the substrate. An epitaxial growth process is performed to grow the S/D regions in the self-aligned recesses. The S/D regions can include in-situ doped regions that are grown and can extend above a substrate top surface. In one embodiment, the S/D regions are formed concurrently in the low current device regions and in the normal device regions. The S/D regions can be formed where the spacers undercut the S/D regions in a channel region of the low current devices.

A low current FET device is realized, which can be employed as a readout FET for cognitive device circuits, such as, e.g., neural networks. The low current characteristics can be achieved using one or more features of the cladding layer. For example, the cladding layer can include a dopant type opposite to that of the S/D regions. A scattering center can be formed within the cladding layer, and an underlap region can be formed using the spacer and recesses in the cladding layer to offset the S/D regions from the channel. Another feature can include a gate conductor that is gapped by an additional distance (thickness of the cladding layer) from the channel region. These features can be combined and adjusted to provide the needed performance characteristics for the low current device. These features can be provided and/or adjusted while still producing normal devices in the same processing sequence.

In block 224, processing continues to complete the device. This can include a replacement metal gate (RMG) process to replace a dummy gate structure (if previously employed). Further processing can include, e.g., middle of the line (MOL) and back end of the line (BEOL) processing. MOL and BEOL of the processing can include the formation of interlevel dielectric layers, contacts, metal lines, etc. This can also include the formation a cross bar metal line grid.

Having described preferred embodiments for a high resistance readout FET for a cognitive device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a source region and a drain region formed in a transistor structure;
a channel region disposed between the source region and the drain region;
a cladding layer formed on the channel region, the cladding layer including a semiconductor material;
a scattering center formed within the cladding layer; and
a gate dielectric of a gate structure formed on the cladding layer, the cladding layer being laterally recessed with respect to the gate dielectric layer to form an underlap region.

2. The semiconductor device as recited in claim 1, wherein the cladding layer includes a doped material including a dopant conductivity opposite to that of the source and drain regions.

3. The semiconductor device as recited in claim 1, wherein the cladding layer includes a doped material including a dopant concentration of between about $5 \times 10^{18}$ to about $5 \times 10^{19}$ atoms/cm$^3$.

4. The semiconductor device as recited in claim 1, wherein the cladding layer includes a thickness between about 2 nm to about 15 nm.

5. The semiconductor device as recited in claim 1, further comprising spacers formed on sidewalls of the gate structure, the spacers covering lateral sides of the cladding layer.

6. The semiconductor device as recited in claim 1, wherein the semiconductor device includes a low current device having a lower channel current than a normal device formed on the semiconductor device.

7. A semiconductor device, comprising:
a substrate;
a cross bar grid formed on the substrate including first lines and second lines formed transversely to the first lines;
transistors formed at intersections of first and second lines of the cross bar grid, the transistors including low current transistors having a lower channel current than normal transistors, the low current transistors including:

a source region and a drain region disposed on the substrate;

a channel region disposed between the source region and the drain region;

a cladding layer formed on the channel region; and a gate dielectric of a gate structure formed on the cladding layer, the cladding layer being laterally recessed with respect to the dielectric layer to form an underlap region.

8. The semiconductor device as recited in claim 7, wherein the cladding layer includes a doped material including a dopant conductivity opposite to that of the source and drain regions.

9. The semiconductor device as recited in claim 7, wherein the cladding layer includes a doped material including a dopant concentration of between about $5 \times 10^{18}$ to about $5 \times 10^{19}$ atoms/cm$^3$.

10. The semiconductor device as recited in claim 7, wherein the cladding layer includes a thickness between about 2 nm to about 15 nm.

11. The semiconductor device as recited in claim 7, further comprising a scattering center formed within the cladding layer.

12. The semiconductor device as recited in claim 7, further comprising spacers formed on sidewalls of the gate structure, the spacers covering lateral sides of the cladding layer.

13. A semiconductor device, comprising:
a low current device having a lower channel current than a normal device formed on the semiconductor device, the low current device including:
a source region and a drain region formed in a transistor structure;
a channel region disposed between the source region and the drain region;
a cladding layer formed on the channel region, the cladding layer including a semiconductor material; and
a gate dielectric of a gate structure formed on the cladding layer, the cladding layer being laterally recessed with respect to the gate dielectric layer to form an underlap region.

14. The semiconductor device as recited in claim 13, wherein the cladding layer includes a doped material including a dopant conductivity opposite to that of the source and drain regions.

15. The semiconductor device as recited in claim 13, wherein the cladding layer includes a doped material including a dopant concentration of between about $5 \times 10^{18}$ to about $5 \times 10^{19}$ atoms/cm$^3$.

16. The semiconductor device as recited in claim 13, wherein the cladding layer includes a thickness between about 2 nm to about 15 nm.

17. The semiconductor device as recited in claim 13, further comprising a scattering center formed within the cladding layer.

18. The semiconductor device as recited in claim 13, further comprising spacers formed on sidewalls of the gate structure, the spacers covering lateral sides of the cladding layer.

19. A semiconductor device, comprising:
a source region and a drain region formed in a transistor structure;
a channel region disposed between the source region and the drain region;
a cladding layer formed on the channel region, the cladding layer including a doped material having a dopant concentration of between about $5 \times 10^{18}$ to about $5 \times 10^{19}$ atoms/cm$^3$; and
a gate dielectric of a gate structure formed on the cladding layer, the cladding layer being laterally recessed with respect to the gate dielectric layer to form an underlap region.

20. The semiconductor device as recited in claim 19, wherein the cladding layer includes a doped material including a dopant conductivity opposite to that of the source and drain regions.

21. The semiconductor device as recited in claim 19, wherein the cladding layer includes a thickness between about 2 nm to about 15 nm.

22. The semiconductor device as recited in claim 19, further comprising a scattering center formed within the cladding layer.

23. The semiconductor device as recited in claim 19, further comprising spacers formed on sidewalls of the gate structure, the spacers covering lateral sides of the cladding layer.

24. The semiconductor device as recited in claim 19, wherein the semiconductor device includes a low current device having a lower channel current than a normal device formed on the semiconductor device.

* * * * *